United States Patent [19]
Stevens et al.

[11] Patent Number: 5,810,931
[45] Date of Patent: Sep. 22, 1998

[54] HIGH ASPECT RATIO CLAMP RING

[75] Inventors: Joe Stevens, San Jose; Howard Grunes, Santa Clara; Igor Kogan, San Francisco, all of Calif.

[73] Assignee: Applied Materials, Inc., Santa Clara, Calif.

[21] Appl. No.: 692,932

[22] Filed: Jul. 30, 1996

[51] Int. Cl.⁶ .......................... C23C 16/00; C23C 14/00; C23F 1/02; B05C 13/00
[52] U.S. Cl. .......................... 118/721; 118/728; 118/500; 118/503; 118/720; 204/298.15; 204/298.11; 156/345
[58] Field of Search .................. 118/728, 725, 118/715, 500, 503, 720, 721; 204/298.15, 298.11; 156/345

[56] References Cited

U.S. PATENT DOCUMENTS

| | | | |
|---|---|---|---|
| 4,458,746 | 7/1984 | Holden | 165/80 A |
| 4,473,455 | 9/1984 | Dean | 204/298.15 |
| 4,978,412 | 12/1990 | Aoki | 156/345 |
| 5,119,761 | 6/1992 | Nakata | 118/725 |
| 5,262,029 | 11/1993 | Erskine | 204/298.15 |
| 5,326,725 | 7/1994 | Sherstinsky | 437/225 |
| 5,376,180 | 12/1994 | Mahler | 118/728 |
| 5,403,459 | 4/1995 | Guo | 204/192.32 |
| 5,421,401 | 6/1995 | Sherstinsky | 165/80.2 |
| 5,437,757 | 8/1995 | Rice | 156/345 |
| 5,439,524 | 8/1995 | Cain | 118/723 E |
| 5,447,570 | 9/1995 | Schmitz | 118/728 |
| 5,456,756 | 10/1995 | Ramaswami et al. | 118/721 |
| 5,460,703 | 10/1995 | Nylman | 204/192.12 |
| 5,534,110 | 7/1996 | Lenz | 156/643.1 |
| 5,540,821 | 7/1996 | Tepman | 204/192.13 |
| 5,632,873 | 5/1997 | Stevens et al. | 204/298.15 |

FOREIGN PATENT DOCUMENTS

| | | | |
|---|---|---|---|
| 0 598 362 A1 | 5/1994 | European Pat. Off. | 118/728 |
| 5-33119 | 2/1993 | Japan | 118/728 |

*Primary Examiner*—R. Bruce Breneman
*Assistant Examiner*—Jeffrie R. Lund
*Attorney, Agent, or Firm*—Patterson & Streets, L.L.P.

[57] ABSTRACT

The present invention provides a method and apparatus for protecting the edge of a substrate and securing the substrate to the support member during processing. The present invention preferably provides minimal contact with the substrate and provides improved edge exclusion. Support tabs extend inwardly from the lower roof surface to support the apparatus on the substrate and the inner terminus of the apparatus approaches the edge of the substrate to provide the improved edge exclusion. A variable height lower roof surface is provided over the edge of the substrate to provide an effective increased roof aspect ratio (width of the roof : height of the roof above the substrate) over the edge of the substrate which reduces the likelihood that a bridging layer will form between the apparatus and the substrate or beyond the substrate.

34 Claims, 6 Drawing Sheets

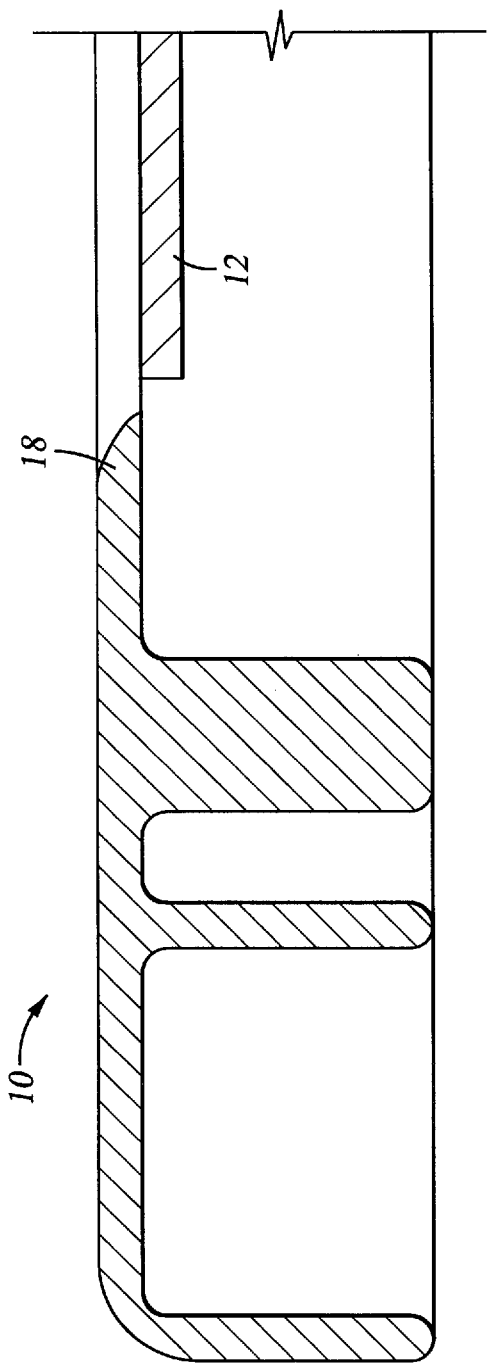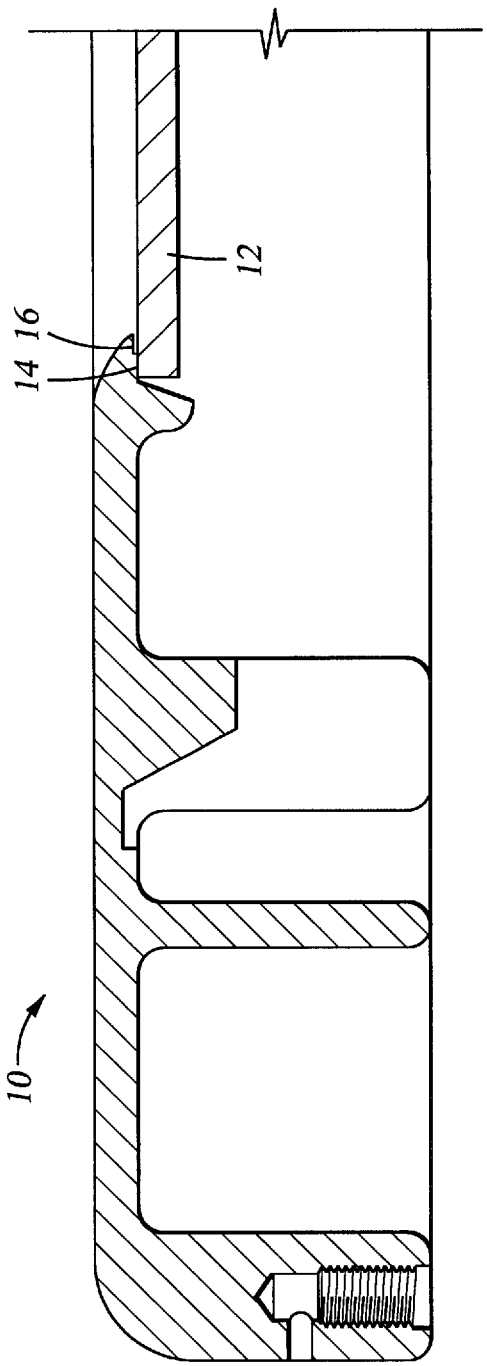
Fig. 2 (PRIOR ART)
Fig. 3 (PRIOR ART)

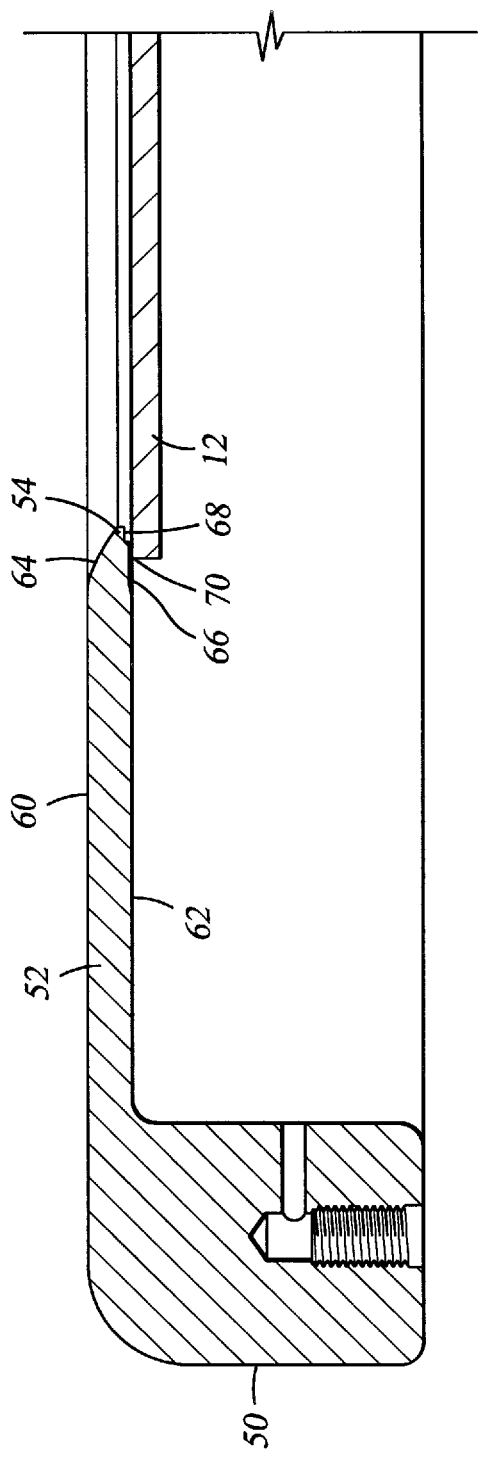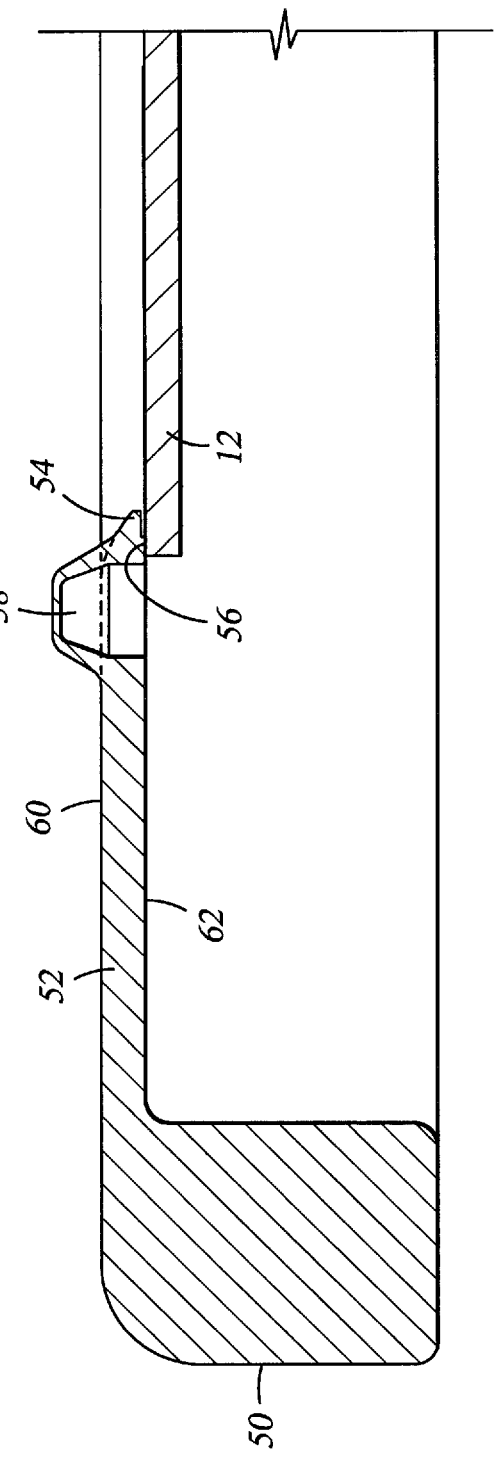

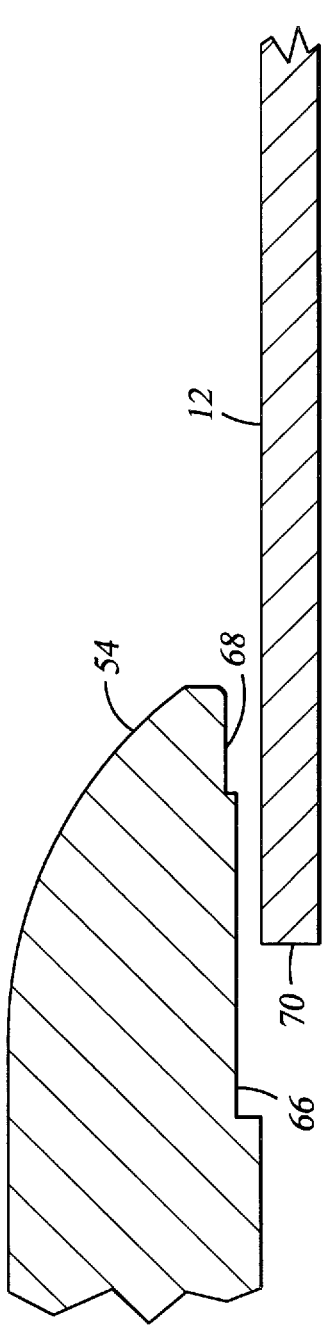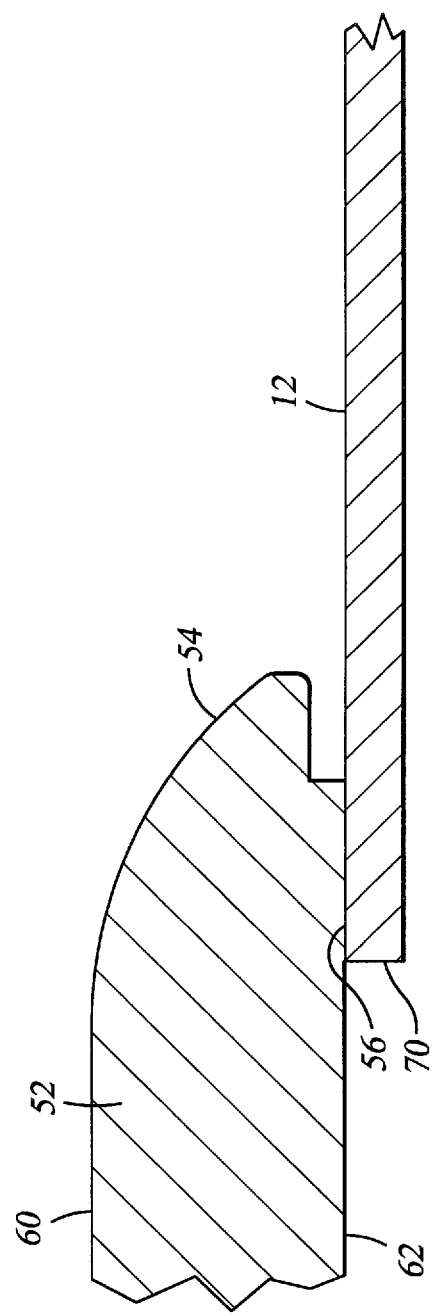

HIGH ASPECT RATIO CLAMP RING

BACKGROUND OF THE INVENTION

1. Field of the Invention

The present invention relates generally to semiconductor processing equipment. More particularly, the present invention relates to an apparatus and method for clamping and shielding the edge of a substrate while providing improved edge exclusion and reducing the incidence of adherence of the substrate to the clamp ring.

2. Background of the Related Art

The fabrication of integrated circuits on substrates, including semiconductor substrates, typically requires the deposition of multiple metal, dielectric and semiconductor film layers on the surface of substrates. The film layers are typically deposited on semiconductor substrates in vacuum processing chambers. One common vacuum deposition process is physical sputtering wherein a target comprised of the deposition material is exposed to a plasma causing atoms or larger particles of target material to be sputtered from the target and deposited on the substrate. A second vacuum deposition process is chemical vapor deposition wherein a chemical vapor is exposed to the substrate causing the formation of a film layer of the vapor components on the surface of the substrate.

A substrate support member, commonly referred to as a pedestal, susceptor or heater, is disposed in the processing chamber to support the substrate thereon. Typically, a clamp ring is disposed in the chamber above the support member and the support member is movable within the chamber. A substrate is introduced into the chamber by a robot and the support member is moved upwardly in the chamber through the substrate and then through the clamp ring disposed thereabove. The substrate is placed on, and secured to, the upper surface of the support member during the deposition process by the clamp ring which is received on the outer edge of the substrate. The means by which the substrate is secured to the pedestal may also include a vacuum chuck, an electrostatic chuck, a clamp ring or a combination of methods.

Clamp rings are generally formed as a metal ring, a portion of which is received on the substrate and exerts a downward force on the top, outer edge of the substrate that has been positioned on a support member. The weight of the clamp ring reduces warping of the substrate and holds the substrate in a fixed position for processing. However, the fact that the clamp ring contacts the top surface of the substrate presents several problems. First, the clamp ring is prone to receiving material deposits thereon as deposition processes are performed on the substrate. These deposits may form a bridging layer between the clamp ring and the substrate which causes the substrate to adhere to the clamp ring, thereby hindering removal of the substrate from the chamber following processing. Secondly, the clamp ring shields a portion of the outer perimeter of the substrate real estate reducing the amount of usable area on the substrate where devices can be formed, a problem generally referred to as "shadowing".

Much effort has been devoted to developing clamp rings and techniques for the use of clamp rings that will shield the edge of substrates and minimize, control or prevent sticking to substrates, without shadowing too much real estate. Clamp rings have been designed with only a few substrate contact surfaces evenly spaced around the perimeter of the substrate in an attempt to reduce the incidence of bridge layer formation. These clamp rings adequately clamp the substrate to the support member, but still shadow the outer perimeter of the substrate. In addition, reducing the number of substrate contact surfaces does not significantly reduce the incidence of sticking.

Another clamp ring has been developed having discrete contacts as described above, but also having a roof or lip to shadow each contact point to reduce sticking of the substrate to the clamp ring at the contact surfaces. This clamp ring is depicted in FIGS. 1–3 and was provided to Siemens in 1991 by the assignee of the present invention. Referring to FIG. 1, the clamp ring 10 is shown positioned around a substrate (shown as dashed line 12) by four equally spaced contact surfaces 14 extending inwardly over the outer edge of the substrate surface. FIGS. 2 and 3 show cross-sectional views of the clamp ring 10 of FIG. 1, taken along lines 2–2 and 3–3 respectively, depicting an inner lip or roof 16, adjacent to the contact surfaces 14, which extends slightly inwardly over the contact surfaces and the substrate edge to shadow the contact surfaces from deposition material. The inner perimeter of that portion 18 of the clamp ring 10 between the contacts 14 is located beyond the outer perimeter of the substrate 12 to maximize the usable area of the substrate. This clamp ring was designed for use with a support member that includes an outer ledge beyond the area of the support member which supports the substrate. The ledge effectively provides a tortuous path around the substrate support member that prevents the deposition material from reaching the area of the chamber beyond the outer perimeter of the support member.

Subsequent chamber designs incorporate support members having a generally cylindrical profile with a diameter only marginally greater than the substrate. Therefore, in PVD, CVD and other integrated circuit fabrication processes, vapors and/or particles passing just beyond the edge of the support member can easily form deposits on all of the interior surfaces of the processing chamber, including the walls of the support member and in the space below the support member. These deposits are known to generate contaminant particles and may eventually affect the motion of the support member. Consequently, there is a need to confine the deposition or etch material to the substrate and surfaces above the support member so that particle generation is reduced and those surfaces having deposits formed thereon can be easily cleaned or replaced with access through the top of the chamber.

Therefore, shield arrangements have been devised to substantially confine the deposition environment to a region adjacent to the deposition receiving surface of the substrate. The shield system typically includes a fixed wall portion 40 (shown in FIG. 4) which extends between the chamber cover and the position within the chamber where the support member is positioned during processing. The fixed wall portion extends around the circumference of the support member when the support member is positioned for processing, and thus it blocks access of the deposition environment to the walls and interior components of the processing chamber including the upper surface of the support member. However, a small gap must be provided between the support member and the shield to allow the support member to retract and extend in the chamber without the risk of the support member contacting the fixed wall portion and thus increasing the incidence of particle formation within the chamber.

The gap between the inner terminus of the fixed wall portion and the support member provides a path for deposition material to enter the regions of the chamber which are intended to be protected by the fixed wall portion and deposit an undesirable film layer on these surfaces. Furthermore, deposition material falling on the support member along the edge of the substrate can readily form a bridging layer between the substrate and the support member which interferes with easy removal of the substrate from the support member.

The most common approach to edge exclusion involves extending the clamp ring across the gap and forming a lip which extends inwardly over the perimeter edge of the substrate received on the support member. The lip is designed with an aspect ratio of lip width (distance the lip extends inward over the perimeter of the substrate) to lip height (above the substrate), so that the lip has sufficient width to shadow the support member or edge of the substrate from deposition and the lip is high enough above the substrate surface to avoid sticking.

Attempts to minimize the loss of substrate real estate require moving the inner terminus of the lip overhanging the edge of the substrate outwardly to more closely approach the edge of the substrate. However, a substantially equivalent degree of edge exclusion requires that the lip aspect ratio remain the same. Therefore, if the inner terminus is moved outwardly toward the edge of the substrate, the lower surface of the lip must more closely approach the upper surface of the substrate to provide the same effective shielding of the substrate edge. This solution is not acceptable, however, because as the lower surface of the lip more closely approaches the substrate surface, the incidence of forming a bridging layer therebetween increases and the throughput of substrates within the system is reduced.

Therefore, there remains a need for a clamp ring that can secure a substrate, reduce warpage of the substrate, eliminate or minimize sticking between the clamp ring and the substrate, provide edge exclusion to prevent bridging between the substrate and the support member, and increase the amount of substrate real estate that can be used to form integrated circuit devices.

SUMMARY OF THE INVENTION

The present invention provides a method and apparatus for securing a substrate to the surface of a support member while shielding the edge of the substrate from receipt of deposition material thereon. The method and apparatus provide for minimal contact with the substrate and provide improved edge exclusion. In one embodiment, the apparatus provides a clamp ring having support tabs extending inwardly from the lower roof surface of the clamp ring to contact the edge of the substrate and an inner overhanging lip having a lower surface of variable height which extends over the substrate edge. Preferably, the roof height over the edge of the substrate decreases as the distance from the inner terminus of the lip to the outer terminus of the lip increases.

In another embodiment of the invention, the lower roof surface overhanging the edge of the substrate is a stepped surface to provide an increased effective roof aspect ratio defined as the width of the roof:height of the roof above the substrate. Preferably, the roof includes two stepped surfaces, the first stepped surface having a lower roof aspect ratio and a second stepped surface having a greater roof aspect ratio. While the number of steps and roof aspect ratios of the steps can be varied depending on the process and preferred edge exclusion, the preferred roof has first and second aspect ratios greater than about 1:1 and between about 2:1 and about 16:1, respectively. In another embodiment of the present invention, the stepped lower roof surface is continuous around the inner perimeter of the clamp ring, including the portions of the lip adjacent to the contact surfaces.

In another aspect of the invention, the lower roof surface overhanging the edge of the substrate is a convex surface having a tangent line that becomes more oblique to normal at points approaching the substrate edge.

In another aspect of the invention, alignment recesses are provided in the lower roof surface to mate with alignment pins provided on the support member to position the clamp ring over the support member as the support member is moved through the clamp ring. The pins and recesses are preferably conical to facilitate mating and resulting alignment of the clamp ring over the support member.

In another aspect of the invention, the contact surfaces of the clamp ring are provided by a plurality of tabs which extend inwardly from the lower roof surface. Preferably, there are six tabs equally spaced around the inner perimeter of the clamp ring, however, as few as three tabs or a continuous surface may be provided thereon.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 2 is a sectional view of a prior art clamp ring;

FIG. 3 is a sectional view of a prior art clamp ring;

FIG. 6 is a sectional view of the clamp ring shown in FIG. 5 along line 6—6;

FIG. 7 is a sectional view of the clamp ring shown in FIG. 5 along line 7—7; and FIG. 8 is a cross sectional view of the lip portion of a clamp ring of the present invention between the tabs or pads; and FIG. 9 is a cross sectional view of the lip portion of a clamp ring of the present invention through at a tab or pad.

DESCRIPTION OF THE PREFERRED EMBODIMENT

A clamp ring of the present invention prevents material being deposited on a semiconductor substrate from being deposited on the periphery of a substrate and on the adjacent surfaces of the substrate support member while providing improved edge exclusion and preventing formation of a bridging layer between the clamp ring and the substrate. The invention is useful for any type of deposition chamber or semiconductor fabrication process, such as a physical vapor deposition (PVD) chamber or a chemical vapor deposition (CVD) chamber for depositing a conductor, semiconductor or dielectric film on a substrate. The invention will be described below in a preferred implementation within a conventional PVD chamber for depositing a metal film on a semiconductor substrate. Before describing the unique features of the invention, the conventional components of the chamber are described below. It is to be understood that while the embodiment described below is an annular member, the shape is not limiting of the scope of the invention.

Conventional Deposition Chamber Components

Figure 1:
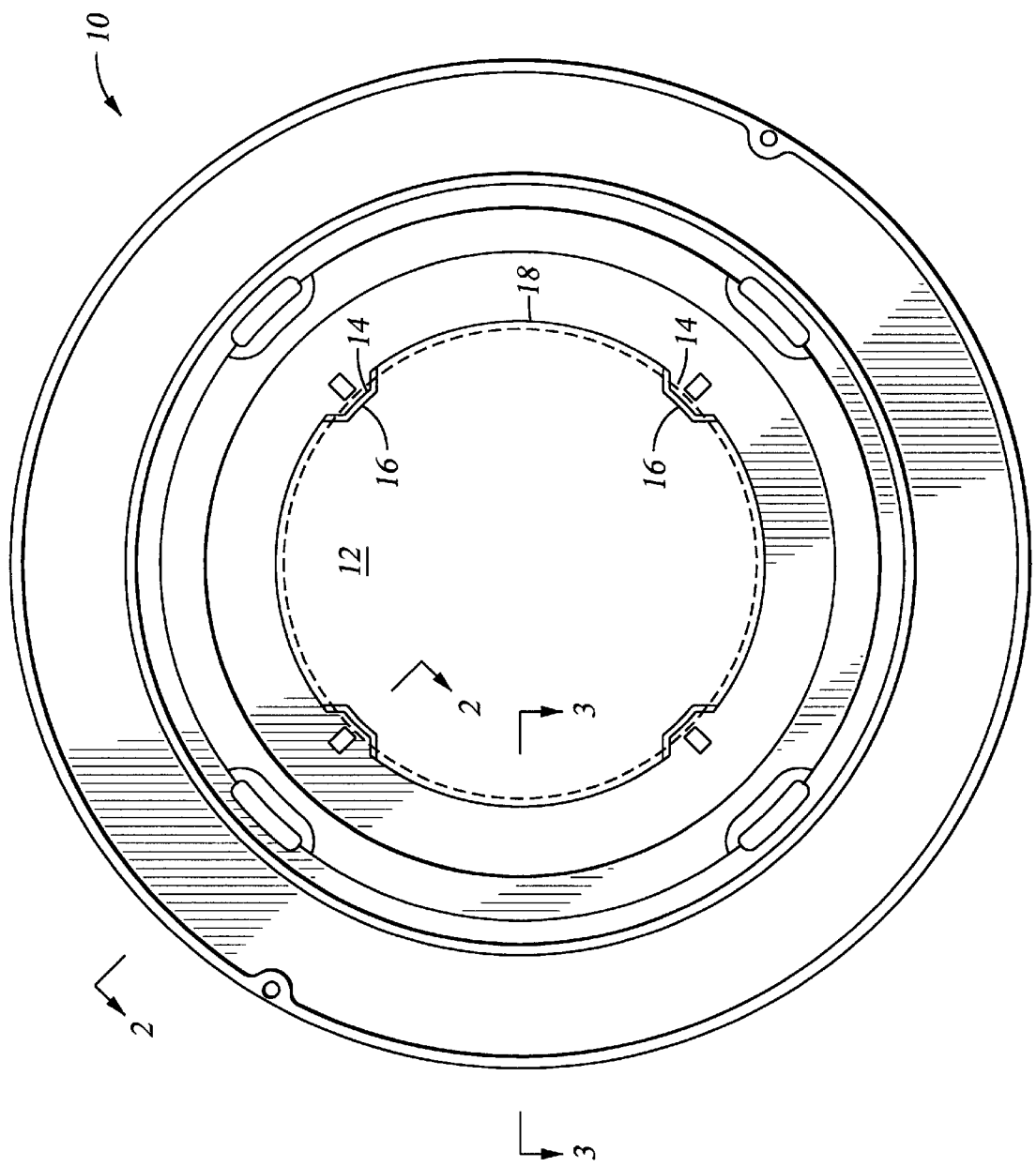
FIG. 1 is a bottom view of a prior art clamp ring.
Figure 4:
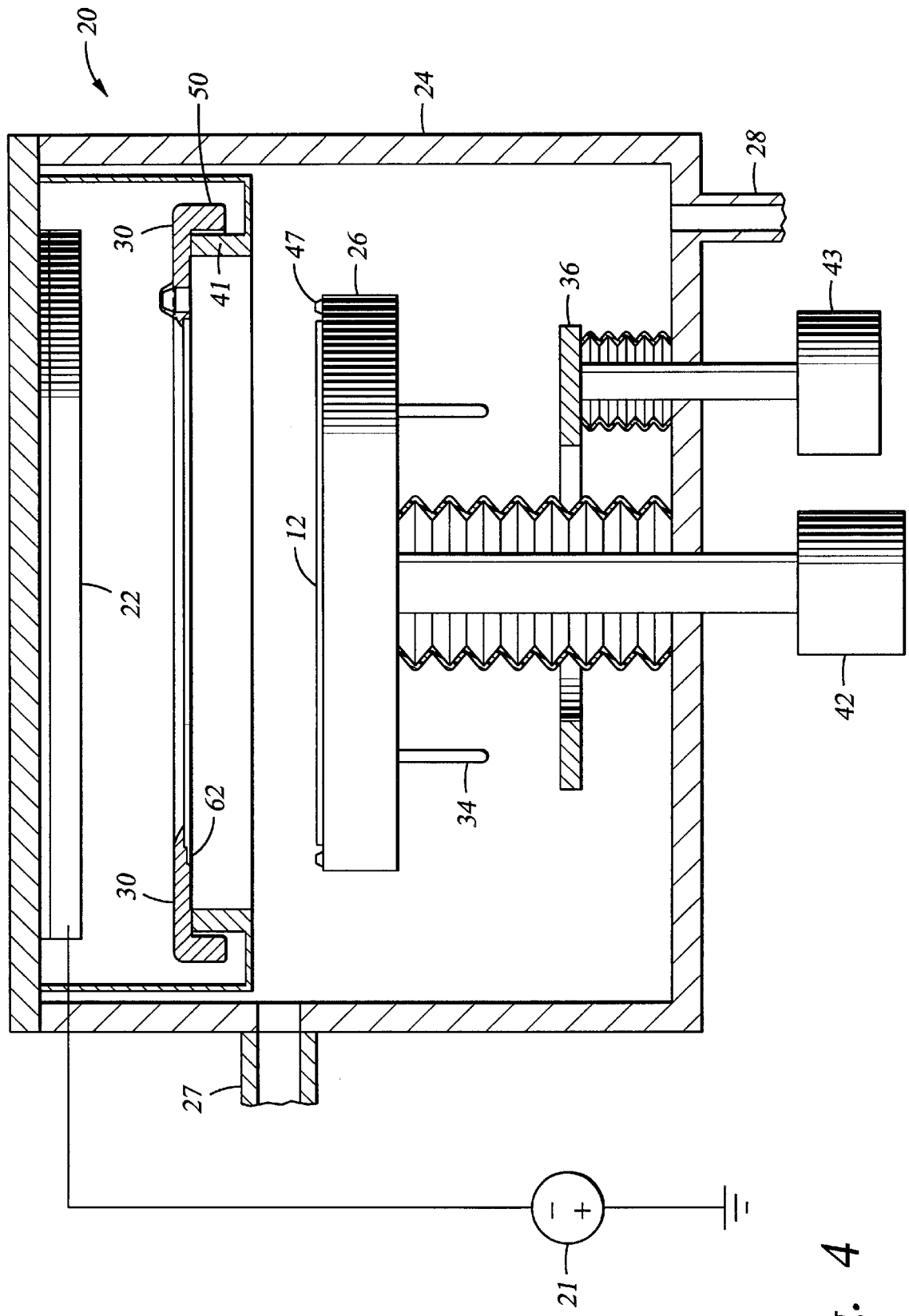
FIG. 4 is a sectional view of a processing chamber showing the arrangement of the shield and the support member in the chamber wherein the support member is positioned below the clamp ring and the shield.

FIG. 4 is a simplified sectional view of a conventional sputtering chamber 20 including a clamp ring 30 of the present invention. The chamber 20 generally includes a chamber enclosure wall 24, having at least one gas inlet 27 and an exhaust outlet 28 connected to an exhaust pump (not shown). A substrate support member 26 is disposed at the lower end of the chamber 20, and a target 22 is received at the upper end of the chamber 20. The target 22 is electrically isolated from the enclosure wall 24 and the enclosure wall is preferably grounded, so that a negative voltage may be maintained on the target 22 with respect to the grounded enclosure wall. A shield 40 is disposed within the chamber, and this shield includes an annular, upturned wall 41 on which the clamp ring 30 may be suspended over the support member 26 when the support member is retracted downwardly in the chamber as shown in FIG. 4.

In preparation for receiving a new semiconductor substrate into the chamber 20, the substrate support member 26 is lowered by a drive mechanism 42 well below the clamp ring suspended on the shield, so that the bottom of the support member is close to a pin positioning platform 36. The support member 26 includes three or more vertical bores (not shown), each of which contains a vertically slidable pin 34. When the support member is in the lowered position just described, the bottom tip of each pin rests on the platform 36, and the upper tip of each pin protrudes above the upper surface of the support member. The upper tips of the pins define a plane parallel to the upper surface of the support member for receipt of a substrate thereon.

A conventional robot arm carries a substrate 12 into the chamber 20 and places the substrate above the upper tips of the pins 34. A lift mechanism 43 moves the pin platform upwardly, to place the upper tips of the pins against the under side of the substrate and additionally lift the substrate off the robot blade. The robot blade then retracts from the chamber 20, and the lift mechanism raises the support member so that the pins slide down in the support member 26, thereby lowering the substrate onto the top of the support member.

The lift mechanism 42 continues to raise the support member 26 so that the periphery of the substrate contacts the inner portion of the annular clamp ring resting on the upturned wall portion 41. The inner diameter of the clamp ring is typically sized slightly smaller than the inner diameter of the substrate to shield the edge of the substrate. As the support member continues moving upwardly, the substrate, supported by the support member, supports the entire weight of the clamp ring 30 and lifts the clamp ring above the upturned wall portion. The clamp ring should be heavy enough to prevent the clamp ring or the substrate from sliding across the surface of the support member. At this point, the positions of the described components are as shown in FIG. 4.

Once the clamp ring is in place, the film deposition process can begin. In the case of the exemplary sputtering chamber 20 shown in FIG. 4, a sputtering process gas (typically argon) is supplied to the chamber through the gas inlet 27, and a DC power supply 21 applies a negative voltage to the sputtering target 22. The voltage excites the argon gas into a plasma state, causing the argon ions to bombard the negatively biased target to sputter material off the target. As shown in FIGS. 6 and 7, the clamp ring includes an overhanging lip around its entire inner perimeter which overhangs, but does not touch, the substrate to shield the perimeter of the substrate immediately below the lip from receiving material being deposited on the substrate. A plurality of tabs formed by the lower roof surface extend inwardly over the edge of the substrate to contact the edge of the substrate during processing and secure the substrate to the support member. The sputtered material then deposits on the substrate, except for the periphery thereof which is shielded by the clamp ring.

After the film layer has been deposited on the substrate, the substrate is removed from the chamber 20 by reversing the sequence of steps by which it was carried into the chamber. Specifically, the lift mechanism 42 lowers the support member below the upturned wall portion 41 so that the clamp ring 30 descends onto the shield 40. At this point, the weight of the clamp ring is supported by the shield, not by the substrate. Ideally, there should be no significant adhesion between the substrate and the clamp ring so that the substrate simply will continue to rest on top of the support member 26 as the support member descends below the clamp ring resting on the shield.

If the substrate sticks to the clamp ring only temporarily and then falls onto the support member, it is likely to be damaged by the impact with the support member. If the substrate adheres more strongly to the clamp ring and does not fall off, then processing must be halted and the chamber 20 must be opened to manually remove the substrate. In either case, the substrate becomes worthless and, in the latter case, down time can be costly. This is a particular problem in the case of metal deposition chambers, because metal conductors generally are the last layers to be deposited on the semiconductor substrate, after the substrate has become valuable because of the number of expensive fabrication steps previously performed on it.

Novel Features of the Clamp Ring

The clamp ring of the present invention provides reduced yet effective contact with the substrate to secure the substrate to the support member while providing improved edge exclusion without increasing the likelihood that a bridging layer will form between the clamp ring and the substrate. Improved edge exclusion maximizes the substrate real estate available for fabrication of die thereon and the reduced contact between the clamp ring and the substrate minimizes the incidence that particles will be generated above the surface of the substrate.

Generally, the present invention accomplishes these advantages by providing a plurality of contacts or tabs extending inwardly from the lower roof surface over the edge of the substrate to support the clamp ring on the substrate and by providing an enlarged inner diameter of the clamp ring in the arcuate region between the tabs to expose more of the substrate to the deposition environment. The lower roof surface between the tabs is stepped to provide a greater effective roof aspect ratio, defined as the ratio of the roof width to the roof height above the substrate. A stepped roof aspect ratio has been found to reduce formation of bridging layers between the clamp ring and the substrate while also shielding the outer edge of the substrate and the gap between the fixed wall portion and the support member.

Typically, the size of the inner diameter of the clamp ring is dictated by the substrate size, the surface area on the clamp ring available for contact with the substrate, and the geometry of the passage provided between the clamp ring and the substrate. Typically, the spacing between the lip of the clamp ring and the substrate is maximized to prevent formation of a bridging layer between the clamp ring and the substrate during processing of a required number of substrates. The spacing in many applications is determined by the desired throughput of substrates for a particular process. That is, the spacing of the lip and the substrate is maximized so that a predetermined number of substrates can be processed before a bridging layer is likely to form between the clamp ring and the substrate and the clamp ring must be replaced or cleaned.

The clamp ring of the present invention increases the usable substrate real estate by using discrete contacts spaced around the inner perimeter of the clamp ring and by providing a stepped lower roof surface on the arcuate region of the clamp ring between the contacts. The addition of a step to a roof having a given roof width provides a greater effective aspect ratio than a standard roof. Conversely, the width of a stepped roof can be reduced while providing substantially the same shadowing and bridging frequency as a wider standard roof. The advantage of using a narrower roof is that the amount of substrate real estate available for fabrication of die thereon is increased.

Figure 5:
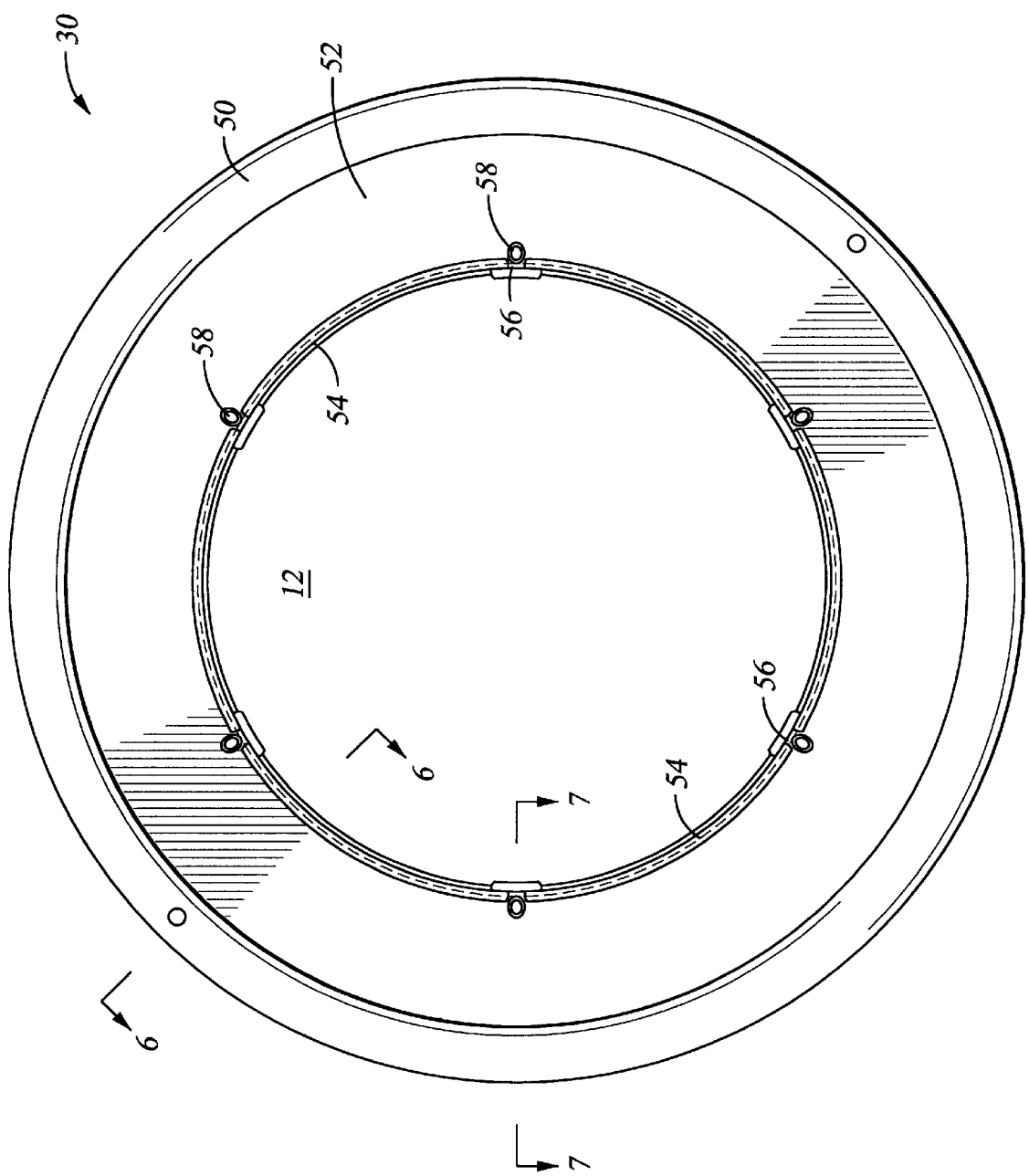
FIG. 5 is a bottom view of the clamp ring shown in FIG. 4.

Now referring to FIG. 5, a bottom view of the clamp ring 30 of FIG. 4 is shown. The clamp ring 30 has an outer flange 50 that cooperates with the upturned wall portion 41 of the shield 40 and a horizontal roof 52 extending radially inward from the flange 50 over the substrate 12 (the outer perimeter shown by a dashed line) having an annular lip 54 on the inner terminus.

As shown in FIG. 6, the preferred embodiment of the clamp ring 30 generally includes an annular, downwardly extending outer flange 50 from which, a horizontal roof 52 having an upper surface 60 and lower surface 62 extends radially inwardly. The horizontal roof 52 terminates at its overhanging lip 54 which overhangs the edge of the substrate 12 during processing.

As shown in FIG. 7, a plurality of contacts or tabs 56 are spaced equally about the inner diameter of the clamp ring and extend inwardly from the lower roof surface to provide substrate contacting surfaces as shown in FIG. 5. The overhanging lip 54 is preferably continuous around the inner perimeter of the clamp ring 30 and preferably the portions of the overhanging lip adjacent to the tabs 56 extend slightly inwardly of the arcuate portion of the lip between the tabs to provide enhanced shielding of the tabs where a bridging layer is most likely to form.

Referring to FIG. 6, the overhanging lip 54 extends inwardly over the edge of the substrate and is preferably stepped on its lower surface between the tabs to provide a variable roof height above the surface of the substrate which decreases as the distance from the inner terminus of the lip to the outer terminus increases. Preferably there are at least two stepped lower surfaces 66 and 68 to provide effective shielding of the substrate 12 edge 70 while preventing sticking of the clamp ring to the substrate. However, the number of steps may vary depending on the materials deposited and the proximity of the inner terminus of the lip to the substrate edge.

FIG. 6 shows a cross sectional view of a clamp ring between the support tabs 56. The roof 52 extends radially inwardly from the outer flange 50 to provide an upper surface 60 for shielding the components of the chamber from the deposition environment and a lower surface 62 for supporting the clamp ring 12 on the shield disposed within the chamber when the support member is in a retracted position. The roof 52 is preferably uniform in thickness across its radius and terminates in a downwardly extending chamfered inner annular edge 64 forming the upper surface of the lip 54. The chamfered edge 64 reduces shadowing of the substrate by decreasing the angle between the upper surface of the roof to maximize available substrate real estate for fabrication of die thereon. The roof 52 may, however, be tapered across its width from a thicker outer portion to a thinner inner portion, or vice versa.

The lower surface 62 of the inner diameter of the roof 52 terminates in an inner lip which includes the multilevel, stepped lower surface as shown in detail in FIG. 8. The portion of the lip located between the tabs preferably has two stepped surfaces 66, 68 which together provide an effective roof aspect ratio equal to or greater than that typically provided by generally planar lower roof surfaces. The variable roof aspect ratios of the stepped surfaces 66, 68 provide an increased effective roof aspect ratio to prevent formation of a bridging layer between the substrate and the clamp ring and to prevent deposition of material on and beyond the edge of the substrate.

Stepped surface 68 preferably has a roof aspect ratio greater than about 1:1 providing a first shielding surface to block a majority of the particles sputtered from the target. It is also preferred that the roof be spaced a sufficient distance from the substrate to prevent a bridging layer from forming between the substrate and the clamp ring for a given number substrate deposition processes. A majority of particles sputtered from a target in a sputter deposition apparatus that are traveling at angles oblique to normal are preferably intercepted by the upper surface and chamfered surface of the lip. The stepped surface 68 is spaced a sufficient distance from the surface of the substrate to prevent a bridging layer from forming therebetween.

However, particles collide with each other and are re-directed and re-sputtered from the walls of the chamber at trajectories which may be more oblique to the surface of the substrate. This phenomenon has prevented those skilled in the art from enlarging the inner diameter of a clamp ring because in order to prevent deposition on or beyond the edge of a substrate as the inner diameter of the clamp ring is increased, the lower surface of the lip must more closely approach the surface of the substrate to provide effective shielding of the substrate edge. It becomes desirable to increase the roof aspect ratio and to decrease the likelihood that a bridging layer will form. Therefore, the inventors have provided a second stepped surface generally having a greater roof aspect ratio than the first stepped surface. While the second stepped surface may be as low as about 1:1, it is preferably between about 2:1 and about 16:1, to increase the overall effective roof aspect ratio of the clamp ring. Less material reaches the second stepped surface which more closely approaches the substrate surface and the likelihood that a bridging layer will form between the clamp ring and substrate is less. By increasing the roof aspect ratio of this second stepped surface the clamp ring has an effective overall roof aspect ratio substantially equal to the roof aspect ratio of the second step. The number of particles which are likely to reach the inner step is minimized by the shielding effect of the first stepped surface. Because the first stepped surface is spaced farther from the surface of the substrate than the second stepped surface, a bridging layer is less likely to form between the substrate the clamp ring.

It is preferred that the tabs 56 extending from the lower roof surface be equally spaced around the inner diameter of the clamp ring to provide minimized contact between the clamp ring. Minimizing contact between the substrate and the clamp ring allows the inner diameter of the clamp ring to be enlarged between the contact surfaces and the contact surfaces can more closely approach the edge of the substrate. Typically, the contact surfaces of the clamp ring are maximized to insure adequate contact between the clamp ring and the substrate to secure the substrate to the support member and to prevent chipping of the substrate edge. Referring to FIGS. 5, 7 and 9, the clamp ring is preferably supported on the substrate on tabs 56 during the deposition process to secure the substrate to the surface of the support member.

The clamp ring is aligned with the support member as the support member moves through the clamp ring supported on the hanger within the chamber. Conical alignment recesses 58 are provided in the lower roof surface to receive mating alignment pins 47 extending radially from the upper surface of the support member 26 to align the clamp ring over the support member. Preferably, six recesses are provided inwardly of the support tabs 56 in the roof of the clamp ring and spaced equally around the inner perimeter of the clamp ring. To prevent shadowing of the substrate by the recesses 58, the recesses are preferably located adjacent the tab because the overhanging lip 54 adjacent the tabs 56 extends farther inwardly than the lip between the tabs.

The alignment pins provided on the support member are preferably tapered from an upper portion down to a base portion having a greater diameter to facilitate alignment between the support member and the clamp ring. As the support member moves through the clamp ring, the upper portion of the alignment pins are received within the larger diameter opening of the recesses and a misaligned clamp ring is moved into alignment with the support member as the support member moves through the clamp ring. There may be any number of contact surfaces on the clamp ring, but the preferred number of contact surfaces is generally between about 2 and about 24. It is also preferred that the contact surfaces be spaced evenly about the perimeter of the ring, i.e., six contact surfaces spaced apart by 60° or three spaced apart by 120°.

While the foregoing is directed to the preferred embodiment of the present invention, other and further embodiments of the invention may be devised without departing from the basic scope thereof, and the scope thereof is determined by the claims which follow.

What is claimed is:

1. An apparatus for shielding an edge of a substrate from a processing environment, comprising:
   a) a roof having an upper surface and a lower surface;
   b) one or more substrate contacting surfaces extending downwardly from the lower roof surface; and
   c) a lip forming an inner terminus of the roof, the lip sized and adapted to extend inwardly over the edge of a substrate and vertically spaced therefrom, the lip having a stepped lower surface comprising at least a first and a second offset lower surface, wherein the first offset lower surface is disposed inwardly from the second offset lower surface and defines a gap between a substrate and the second offset surface defines a smaller gap between a substrate.

2. The apparatus of claim 1, wherein the substrate contacting surface is a continuous surface and the lip is disposed inwardly of the contacting surface.

3. The apparatus of claim 2, further comprising a downwardly extending step in the second lower surface of the lip.

4. The apparatus of claim 1, wherein the substrate contacting surface comprises a plurality of tabs extending downwardly from the lower roof surface.

5. The apparatus of claim 4, wherein the second offset lower surface of the lip is located between the tabs.

6. The apparatus of claim 4, further comprising a plurality of alignment recesses positioned radially outward from the plurality of tabs.

7. The apparatus of claim 1, wherein an inner terminus of the upper roof surface is tapered.

8. The apparatus of claim 1, wherein the first and the second offset lower surfaces of the lip are variable height surfaces.

9. An apparatus for processing semiconductor substrates, comprising:
   a) a vacuum enclosure;
   b) a substrate support member positionable within the vacuum enclosure for supporting a substrate in the enclosure;
   c) a shield member positionable within the chamber defining an inner passage through which the support member is movable;
   d) a clamp ring positionable within the chamber on the shield member, the clamp ring comprising a roof and an inner lip, the roof having an upper and a lower surface, the lower surface having one or more substrate contacting surfaces disposed downwardly therefrom and the inner lip sized and adapted to extend inwardly over the edge of a substrate vertically spaced therefrom, the first offset lower surface disposed inwardly from the second offset lower surface; and the first offset lower surface vertically spaced from the substrate contacting surface at a greater distance than the second offset lower surface.

10. The apparatus of claim 9, wherein the one or more substrate contacting surfaces comprise a plurality of tabs spaced around the lower roof surface, extending downwardly from the lower roof surface.

11. The apparatus of claim 9, wherein the substrate contacting surfaces comprise a continuous surface and at least two stepped surfaces are disposed inwardly from the continuous surface.

12. The apparatus of claim 9, wherein an upper terminus of the inner lip is chamfered.

13. The apparatus of claim 9, wherein the clamp ring further comprises an outer flange extending downwardly from the outer perimeter of the roof.

14. The apparatus of claim 9, wherein the clamp ring includes one or more alignment recesses in the lower roof surface and the support member includes one or more alignment pins extending radially therefrom and adapted to be received in an alignment recess.

15. In an annular shield for preventing deposition on an edge of a substrate in a processing chamber comprising a roof having an upper and lower surface, the improvement comprising:
   a) an inner lip located about an inner perimeter of the shield, the inner lip sized and adapted to extend inwardly over an edge of a substrate and spaced therefrom, the lip having a stepped lower surface comprising at least a first and a second offset lower surface, the first offset lower surface vertically spaced from a substrate contacting surface at a greater distance than the second offset lower surface; the first offset lower surface disposed inwardly from the second offset lower surface wherein the first offset lower surface provides a lower roof aspect ratio than the second offset lower surface.

16. The shield of claim 15, further comprising one or more substrate contacting surfaces disposed inwardly from the inner lip.

17. The shield of claim 16, wherein the stepped lower surface of the inner lip is located between the substrate contacting surfaces.

18. The shield of claim 16, wherein the inner diameter of the lip adjacent the substrate contacting surfaces is smaller than the inner diameter of the lip located between the substrate contacting surfaces.

19. The shield of claim 15 further comprising an alignment recess having a generally conical shape disposed in the lower roof surface.

20. An apparatus for shielding and clamping a substrate, comprising:

a) a clamping portion having a substrate contacting surface; and b) a shielding portion connected to the clamping portion, the shielding portion having a first and a second offset lower surface, the shielding portion sized and adapted to extend inwardly over an edge of a substrate and vertically spaced therefrom, the shielding portion having a stepped lower surface comprising at least a first and a second offset lower surface, the second offset lower surface disposed outwardly from and extending downwardly below the first offset lower surface.

21. The apparatus of claim 20, wherein the substrate contacting surface is a continuous surface.

22. The apparatus of claim 20, wherein the substrate contacting surface comprises a plurality of tabs spaced around an edge of the substrate.

23. The apparatus of claim 22, wherein the second lower surface of the shield portion is located between the tabs.

24. The apparatus of claim 22, wherein the shielding portion adjacent the tabs extends more radially inwardly than the shielding portion located between the tabs.

25. The apparatus of claim 22, further comprising a plurality of alignment recesses positioned radially outward from the plurality of tabs; the alignment recesses having a generally conical shape.

26. The apparatus of claim 20, wherein the shield portion has an upper inner annular edge tapered radially inward.

27. The apparatus of claim 20, wherein the first and second lower surfaces are variable height surfaces.

28. The apparatus of claim 20, wherein the first and second lower surfaces have a first and second roof aspect ratios respectively, the second roof aspect ratio being greater than the first roof aspect ratio.

29. An apparatus for shielding an edge of a substrate surfaces comprising:

a) a first shield portion having a first roof aspect ratio; and b) a second shield portion having a second roof aspect ratio, the second shield portion disposed outwardly from the first shield portion and extending downwardly below the first shield portion, the first and second shield portions sized and adapted to extend over an edge of a substrate and spaced therefrom.

30. The apparatus of claim 29 wherein the first roof aspect ratio is lower than the second roof aspect ratio.

31. The apparatus of claim 30 wherein the first shield portion has a roof aspect ratio of about 1:1.

32. The apparatus of claim 31 wherein the second shield portion has a roof aspect ratio between about 2:1 and about 16:1.

33. The apparatus of claim 29 wherein the first and second shield portions provide an effective roof aspect ratio higher than the first roof aspect ratio.

34. In an apparatus for shielding an edge of a substrate surface comprising a first shield portion having a first roof aspect ratio, the improvements comprising:

a second shield portion having a second roof aspect ratio, the second shield portion extending downwardly and radially outwardly from the first shield portion, the first and second shield portions sized and adapted to extend above an edge of a substrate.

* * * * *

UNITED STATES PATENT AND TRADEMARK OFFICE
CERTIFICATE OF CORRECTION

PATENT NO. : 5,810,931
DATED : September 22, 1998
INVENTOR(S) : Joe Stevens, Howard Grunes, Igor Kogan It is certified that error appears in the above-identified patent and that said Letters Patent is hereby corrected as shown below:

In column 12, line 8, after " substrate" please replace "surfaces" with --surface-- and insert a --,-- after "surface".

Signed and Sealed this

Twenty-second Day of June, 1999

Attest:

Q. TODD DICKINSON

*Attesting Officer*   *Acting Commissioner of Patents and Trademarks*